US006853476B2

(12) United States Patent
Martin et al.

(10) Patent No.: US 6,853,476 B2
(45) Date of Patent: Feb. 8, 2005

(54) CHARGE CONTROL CIRCUIT FOR A MICRO-ELECTROMECHANICAL DEVICE

(75) Inventors: Eric T. Martin, Corvallis, OR (US); Adam L. Ghozeil, Corvallis, OR (US); Arthur Piehl, Corvallis, OR (US); James R. Przybyla, Philomath, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 67 days.

(21) Appl. No.: 10/428,169

(22) Filed: Apr. 30, 2003

(65) Prior Publication Data

US 2004/0217378 A1 Nov. 4, 2004

(51) Int. Cl.[7] ......................... G02B 26/00; H01L 21/20; H01L 21/3213; H01G 5/01; G09G 3/34

(52) U.S. Cl. ........................ 359/290; 359/291; 359/293; 359/295; 359/298; 438/379; 257/312; 257/414; 257/532; 257/534; 361/278; 361/277; 361/281; 361/290; 345/84; 333/156; 333/202; 333/262; 333/277

(58) Field of Search ................................. 359/290, 291, 359/293, 295, 298, 230, 231; 438/379; 257/312, 414, 415, 532, 534; 361/277, 278, 281, 283.2, 290, 291, 292; 345/84, 85; 333/202, 156, 262, 277, 161, 164

(56) References Cited

U.S. PATENT DOCUMENTS 5,654,819 A * 8/1997 Goossen et al. ............ 359/291
5,822,110 A * 10/1998 Dabbaj ........................ 359/293
5,991,066 A * 11/1999 Robinson et al. ........... 359/293
6,329,738 B1 12/2001 Hung et al.
6,339,493 B1 1/2002 Scalora et al.
6,355,534 B1 3/2002 Cheng et al.
6,373,682 B1 4/2002 Goodwin-Johansson
6,377,438 B1 4/2002 Deane et al.
6,404,304 B1 6/2002 Kwon et al.
6,418,006 B1 7/2002 Liu et al.
6,441,449 B1 8/2002 Xu et al.
6,509,812 B2 1/2003 Sayyah
6,519,073 B1 * 2/2003 Goossen ...................... 359/290
6,635,919 B1 * 10/2003 Melendez et al. .......... 257/312
6,642,913 B1 * 11/2003 Kimura et al. ................ 345/84

OTHER PUBLICATIONS

Hung, Elmer S. et al., "Extending the Travel Range of Analog–Tuned Electrostatic Actuators," Journal of Microelectromechanical Systems, vol. 8, No. 4, Dec. 1999.

* cited by examiner

*Primary Examiner*—Loha Ben

(57) ABSTRACT

A charge control circuit for controlling a micro-electromechanical device having a variable capacitance is disclosed. In one embodiment, a charge storage device is configured to store a charge amount. A switch circuit is configured to control the variable capacitance of the micro-electromechanical device by sharing the charge amount between the charge storage device and the micro-electromechanical device to equalize the charge storage device and the micro-electromechanical device to a same voltage.

31 Claims, 4 Drawing Sheets

CHARGE CONTROL CIRCUIT FOR A MICRO-ELECTROMECHANICAL DEVICE

CROSS REFERENCE TO RELATED APPLICATIONS

This patent application is related to U.S. patent application Ser. No. 10/428,261 filed concurrently herewith and entitled "Optical Interference Display Device," which is herein incorporated by reference.

THE FIELD OF THE INVENTION

The present invention relates to the field of micro-electromechanical devices. More particularly, the present invention relates to a charge control circuit for a micro-electromechanical device.

BACKGROUND OF THE INVENTION

Micro-electromechanical systems (MEMS) are systems which are developed using thin film technology and which include both electrical and micro-mechanical components. MEMS devices are used in a variety of applications such as optical display systems, pressure sensors, flow sensors and charge control actuators. MEMS devices use electrostatic force or energy to move or monitor the movement of micro-mechanical electrodes which can store charge. The size of a gap between the electrodes is controlled by balancing an electrostatic force and a mechanical restoring force. Digital MEMS devices use two gap distances, while analog MEMS devices use multiple gap distances.

MEMS devices have been developed using a variety of approaches. In one approach, a deformable deflective membrane is positioned over an electrode and is electrostatically attracted to the electrode. Other approaches use flaps or beams of silicon or aluminum which form a top conducting layer. With optical applications, the conducting layer is reflective and is deformed using electrostatic force to scatter light which is incident upon the conducting layer.

These approaches suffer from electrostatic instability which results in a greatly reduced range of motion. The instability occurs when a voltage controlling the electrodes is increased to control the gap distance. Since the electrodes form a variable capacitor, charge runaway results when the capacitance is increased due to decreasing gap distance. As the capacitance is increased, more and more electrical charge is pulled onto the capacitor, resulting in charge runaway. Since the amount of charge stored on the capacitor is not controlled, control of the electrode movement is possible for only about ⅓ of the total gap distance, because outside of this range the electrode will "snap down" to mechanical stops. Thus, a non-linear relationship exists between the electrode voltage and electrode displacement over a large range of gap distances. This inability to control the gap distance for more than about ⅓ of the total gap distance limits the utility of the MEMS devices. For example, with optical display systems, interference or defraction based light modulator MEMS devices preferably should have a large range of gap distance control in order to control a greater optical range of visible light scattered by the optical MEMS device.

SUMMARY OF THE INVENTION

One aspect of the present invention provides a charge control circuit for controlling a micro-electromechanical device having a variable capacitance. In one embodiment, a charge storage device is configured to store a charge amount. A switch circuit is configured to control the variable capacitance of the micro-electromechanical device by sharing the charge amount between the charge storage device and the micro-electromechanical device to equalize the charge storage device and the micro-electromechanical device to a same voltage.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
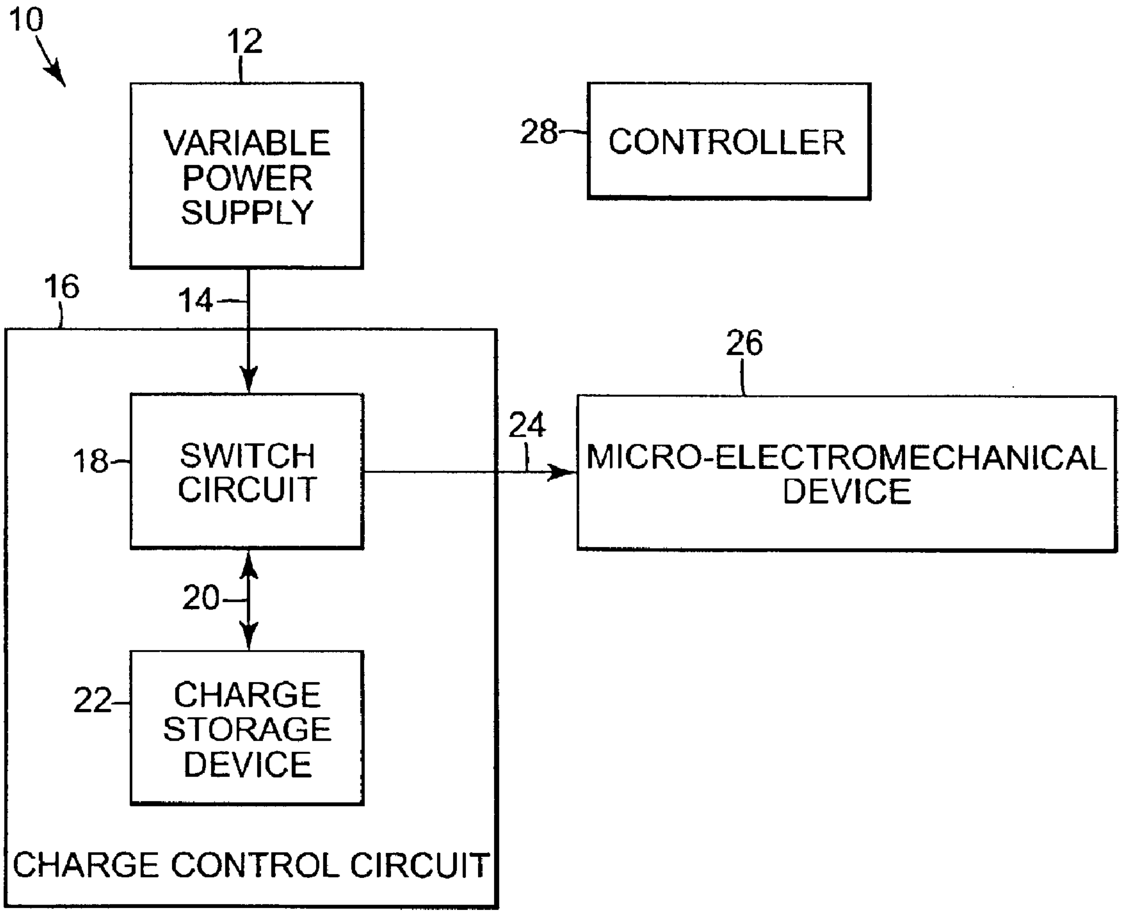
FIG. 1 is a diagram illustrating an exemplary embodiment of a micro-electromechanical system according to the present invention.

FIG. 1 is a diagram illustrating an exemplary embodiment of a micro-electromechanical system 10 according to the present invention. The micro-electromechanical system 10 includes a variable power supply 12, a charge control circuit 16, a micro-electromechanical device 26 and a controller 28. In the exemplary embodiment, charge control circuit 16 includes a switch circuit 18 and a charge storage device 22. In the exemplary embodiment, micro-electromechanical device 26 is controlled by charge and has a variable capacitance which is selected by sharing a charge amount between charge storage device 22 and micro-electromechanical device 26. Charge storage device 22 is configured to store the charge amount. To select a capacitance of the micro-electromechanical device 26, the charge amount stored in charge storage device 22 is shared between charge storage device 22 and micro-electromechanical device 26 so that charge storage device 22 and micro-electromechanical device 26 are equalized to a same voltage. With this approach, the charge stored in micro-electromechanical device 26 selects the capacitance of micro-electromechanical device 26 and can be precisely controlled. This is because charge storage device 22 and micro-electromechanical device 26 are equalized to a same voltage and the relationship between the charge amount and the capacitance of micro-electromechanical device 26 is known. The relationship between the charged stored in micro-electromechanical device 26 and the capacitance of micro-electromechanical device 26 is linear over a wide range of gap distances or widths.

In the exemplary embodiment, variable power supply 12 is a variable voltage source which is coupled to switch circuit 18 and which is configured to supply the charge amount to charge storage device 22. In the exemplary embodiment, controller 28 selects or controls the amount of charge provided by variably power supply 12 to charge storage device 22 in order to select the capacitance of micro-electromechanical device 26. In other embodiments, other approaches can be used to select the amount of charge provided by variable power supply 12 to charge storage device 22. In the exemplary embodiment, variable power supply 12 is a variable voltage source and supplies the charge amount to charge storage device 22 by charging charge storage device 22 from a ground potential to a voltage which corresponds to the charge amount. The voltage is selected by controller 28 which controls variable power supply 12. In various other embodiments, other approaches can be used to control variable power supply 12. In various other embodiments, variable power supply 12 is a current source which is configured to supply the charge amount to charge storage device 22. In the exemplary embodiment, charge storage device 22 is a capacitor. In other embodiments, charge storage device 22 can be embodied in any means or approach which can be used to store the charge amount.

In the exemplary embodiment, micro-electromechanical device 26 is a variable capacitor in which the capacitance is selected according to the charge stored in micro-electromechanical device 26. In one embodiment, micro-electromechanical device 26 is an electrostatically controlled parallel plate actuator which includes a first plate 30 and a second plate 32 (see also, FIG. 2). The parallel plate actuator has a variable capacitance which is selected by storing a predetermined amount of charge on the first plate 30 and the second plate 32. In one embodiment, micro-electromechanical device 26 is a passive pixel mechanism which includes an electrostatically adjustable top reflector 30 and bottom reflector 32 which are configured to define a resonant optical cavity 34.

In the exemplary embodiment, micro-electromechanical device 26 is a variable capacitor which is charged, controlled or selected in accordance with the amount of charge stored by micro-electromechanical device 26. In an exemplary method, the charge amount is stored in charge storage device 22. Next, the charge amount stored in charge storage device 22 is shared between charge storage device 22 and micro-electromechanical device 26 to equalize charge storage device 22 and micro-electromechanical device 26 to a same voltage value. In the exemplary method, controller 28 controls variable power supply 12 and selects an output voltage provided by variable power supply 12 at line 14. Controller 28 activates switch circuit 18 which provides a conductive path between variable power supply 12 and charge storage device 22 so that charge storage device 22 can be charged up to the selected voltage. Next, switch circuit 18 provides a conductive path between charge storage device 22 and micro-electromechanical device 26 to equalize charge storage device 22 and micro-electromechanical device 26 to a same voltage. Once charge storage device 22 and micro-electromechanical device 26 have equalized to the same voltage, charge conduction between charge storage device 22 and micro-electromechanical device 26 ceases. A precise relationship can be established between the voltage selected by variable power supply 12, or alternatively, the charge amount stored by charge storage device 22, and the capacitance of micro-electromechanical device 26.

In the exemplary embodiment, a number of suitable voltage values provided by variable power supply 12 can be selected, wherein each one of the number of voltage values corresponds to a capacitance of micro-electromechanical device 26. The capacitance of micro-electromechanical device 26 is selected by charging charge storage device 22 up to the selected voltage value, and sharing the charge amount stored in charge storage device 22 which corresponds to the selected voltage value with micro-electromechanical device 26 so that charge storage device 22 and micro-electromechanical device 26 are equalized to the same voltage value.

Figure 2:
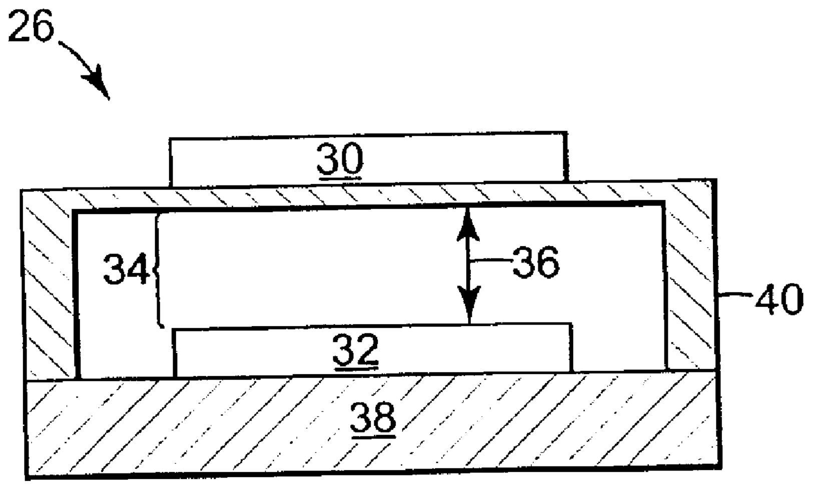
FIG. 2 is a diagram illustrating an exemplary embodiment of a micro-electromechanical device.

FIG. 2 is a diagram illustrating an exemplary embodiment of a micro-electromechanical device 26. In the exemplary embodiment, micro-electromechanical device 26 displays, at least partially, a pixel of a displayable image. The device 26 includes a top reflector 30 and a bottom reflector 32, as well as a flexure 38 and a spring mechanism 40. A resonant optical cavity 34 is defined by the reflectors 30 and 32, which has a variable thickness, or width, 36. The top reflector 30 is in one embodiment semi-transparent or semi-reflective. The bottom reflector 32 is in one embodiment highly reflective or completely reflective. In other embodiments, the top reflector 30 is highly reflective or completely reflective and the bottom reflector 32 is semi-transparent or semi-reflective. In various embodiments, spring mechanism 40 can be any suitable flexible material, such as a polymer, that has linear or non-linear spring functionality.

In the exemplary embodiment, the optical cavity 34 is variably selective of a visible wavelength at an intensity by optical interference. Depending on the desired configuration of micro-electromechanical device 26, the optical cavity 34 can either reflect or transmit the wavelength at the intensity. That is, the cavity 34 can be reflective or transmissive in nature. No light is generated by optical cavity 34, so that the device 26 relies on ambient light or light provided by micro-electromechanical device 26 that is reflected or transmitted by the cavity 34. The visible wavelength selected by the optical cavity 34, and its intensity selected by the optical cavity 34, are dependent on the thickness 36 of the cavity 34. That is, the optical cavity 34 can be tuned to a desired wavelength at a desired intensity by controlling its thickness 36.

The flexure 38 and the spring mechanism 40 allow the thickness 36 of the cavity 34 to vary, by allowing the top reflector 30 to move. More generally, the flexure 38 and the spring mechanism 40 constitute a mechanism that allows variation of the optical properties of the optical cavity 34 to variably select a visible wavelength at an intensity. The optical properties include an optical index of cavity 34, and/or the optical thickness of cavity 34. An electrical charge stored on reflectors 30 and 32 causes the thickness 36 of cavity 34 to change, because the flexure 38 and the spring mechanism 40 allows the reflector 30 to move. Thus, the flexure 38 has a stiffness, and the spring mechanism 40 has a spring restoring force, such that the charge stored on reflectors 30 and 32 causes the flexure 38 and the spring mechanism 40 to yield and allow the reflector 30 to move, thereby achieving the desired thickness 36. No power is dissipated in maintaining a given thickness 36.

In the exemplary embodiment, the bottom reflector 32 is maintained at a fixed voltage. In one embodiment, the fixed voltage is a ground potential. In the exemplary embodiment, when charge is stored on reflectors 30 and 32, reflector 30 has a voltage which corresponds to the stored charge and the fixed voltage of the bottom reflector. The charge corresponds to the desired visible wavelength and the desired intensity, as calibrated to the stiffness of flexure 38. Whereas the flexure 38 illustrated in the exemplary embodiment is positioned under the bottom reflector 32, in another embodiment, it can be positioned over the bottom reflector 32. In other embodiments, flexure 38 can be positioned over or under top reflector 30 as well, such that the bottom reflector 32 is movable, instead of the top reflector 30, to adjust the thickness 36 of the optical cavity 34. Furthermore, in other embodiments, there can be more than one optical cavity, such that optical cavity 34 is inclusive of more than one such cavity.

In one embodiment, the bottom reflector 32 and the top reflector 30 are plates of a variable capacitor, or of a parallel plate actuator, where the optical cavity 34 represents the dielectric therebetween. Charge stored on the top reflector 30 and the bottom reflector 32 moves the top reflector 30, due to the flexure 38 and the spring mechanism 40. It is this electrostatic charge that allows maintenance of the given thickness 36 without any further charge application over the top reflector 30 and the bottom reflector 32.

In the exemplary embodiment, the wavelength and the intensity selected by optical cavity 34 corresponds to a pixel of a displayable image. Thus, in one embodiment, the micro-electromechanical device 26 at least partially displays the pixel of the image. Micro-electromechanical device 26 can operate in either an analog or a digital mode. In one embodiment, as an analog device, the device 26 selects a visible wavelength of light and an intensity corresponding to the color and the intensity of the color of the pixel. In an alternative embodiment, the device 26 is used to display the pixel in an analog manner in black-and-white, or in gray scale, in lieu of color.

In one embodiment, as a digital device, the micro-electromechanical device 26 is responsible for either the red, green, or blue color component of the pixel. The device 26 maintains a static visible wavelength, either red, green, or blue, and varies the intensity of this wavelength corresponding to the red, green, or blue color component of the pixel. Therefore, three micro-electromechanical devices 26 are needed to display the pixel digitally, where one device 26 selects a red wavelength, another device 26 selects a green wavelength, and a third device 26 selects a blue wavelength. More generally, there is a micro-electromechanical device 26 for each color component of the pixel, or portion of the image. In an alternative embodiment, the micro-electromechanical device 26 can be used to display the pixel in a digital manner in black-and-white, or in gray scale, in lieu of color.

In the exemplary embodiment, the optical cavity 34 of the micro-electromechanical device 26 utilizes optical interference to transmissively or reflectively select a wavelength at an intensity. The optical cavity 34 in one embodiment is a thin film having a light path length equal to the thickness 36. Light is reflected from the boundaries of the reflectors 30 and 32 on either side of the cavity 34, interfering with itself. The phase difference between the incoming beam and its reflected image is k(2d), where d is the thickness 36, because the reflected beam travels the distance 2d within the cavity 34. Since $$k = \frac{2\pi}{\lambda},$$

then when $$d = \frac{\lambda}{2},$$

the phase difference between the incoming and the reflected waves is k2d=2π giving constructive interference. All multiples of $$\frac{\pi}{2},$$

which are the modes of the optical cavity 34, are transmitted. As a result of optical interference, then, the optical cavity 34 passes the most light at integer multiples of $$\frac{\lambda}{2},$$

and the least amount of light at odd integer multiples of $$\frac{\lambda}{4}.$$

In the exemplary embodiment, the flexure 38 and the spring mechanism 40 allow the thickness 36 of the optical cavity 34 to vary when an appropriate amount of charge has been stored on the reflectors 30 and 32, such that a desired wavelength at a desired intensity is selected. This charge, and the corresponding voltage, is determined in accordance with the following equation, which is the force of attraction between the reflectors 30 and 32 acting as plates of a parallel plate capacitor, and does not take into account fringing fields:

$$F = \frac{\varepsilon_0 V^2 A}{2d^2}, \tag{1}$$

where $\epsilon_0$ is the permittivity of free space, V is the voltage across the reflectors 30 and 32, A is the area of each of the reflectors 30 and 32, and d is the thickness 36. Thus, a one volt potential across a 26 micron square pixel, with a thickness 36 of 0.25 microns, yields an electrostatic force of $7\times10^{-7}$ Newtons (N).

Therefore, an amount of charge corresponding to a small voltage between the reflectors 30 and 32 provides sufficient force to move the top reflector 30, and hold it against gravity and shocks. The electrostatic charge stored in the reflectors 30 and 32, is sufficient to hold the top reflector 30 in place without additional power. In various embodiments, charge leakage may require occasional refreshing of the charge.

In the exemplary embodiment, the force defined in equation (1) is balanced with the linear spring force provided by the spring mechanism 40:

$$F = k(d_0 - d), \tag{2}$$

where k is the linear spring constant, and $d_0$ is the initial value of the thickness 36. Because the capacitance is controlled by charge, the force between the reflectors 30 and 32 of equation (1) can instead be written as a function of charge:

$$F = \frac{-Q^2}{2\varepsilon A}, \quad (3)$$

where Q is the charge on the capacitor. The force F is a function of charge and is not a function of the distance d, so that stability of the reflector 30 exists over the entire range of 0 to $d_0$. By controlling the amount of charge on the reflectors 30 and 32, the position of the reflector 30 can be set over the entire range of travel.

Although the description of the preceding paragraphs is with respect to an ideal parallel-plate capacitor and an ideal linear spring restoring force, those of ordinary skill within the art can appreciate that the principle described can be adapted to other micro-electromechanical devices 26, such as interference-based or diffraction-based display devices, parallel plate actuators, non-linear springs and other types of capacitors. With display devices, when the usable range is increased, more colors, saturation levels, and intensities can be achieved.

In one embodiment, micro-electromechanical device 26 is a parallel plate actuator 26. Parallel plate actuator 26 includes a flexure 38 in a spring mechanism 40. Spring mechanism 40 is adapted to support a first plate 30 and provide a restoring force to separate the first plate 30 from the second plate 32. Flexure 38 is attached to spring mechanism 40 and is adapted to support second plate 32. The spring mechanism 40 and flexure 38 maintain the first plate 30 in an approximately parallel orientation with respect to the second plate 32 at a deflection distance 36 or thickness 36.

In one embodiment, micro-electromechanical device 26 is a passive pixel mechanism 26. The pixel mechanism 26 includes an electrostatically adjustable top reflector 30 and bottom reflector 32 which are configured to define a resonant optical cavity 34. Charge control circuit 16 is configured to select a visible wavelength of the passive pixel mechanism 26 by sharing a stored charge amount with the top reflector 30 and the bottom reflector 32, to control a deflection distance 36 or thickness 36.

Figure 3:
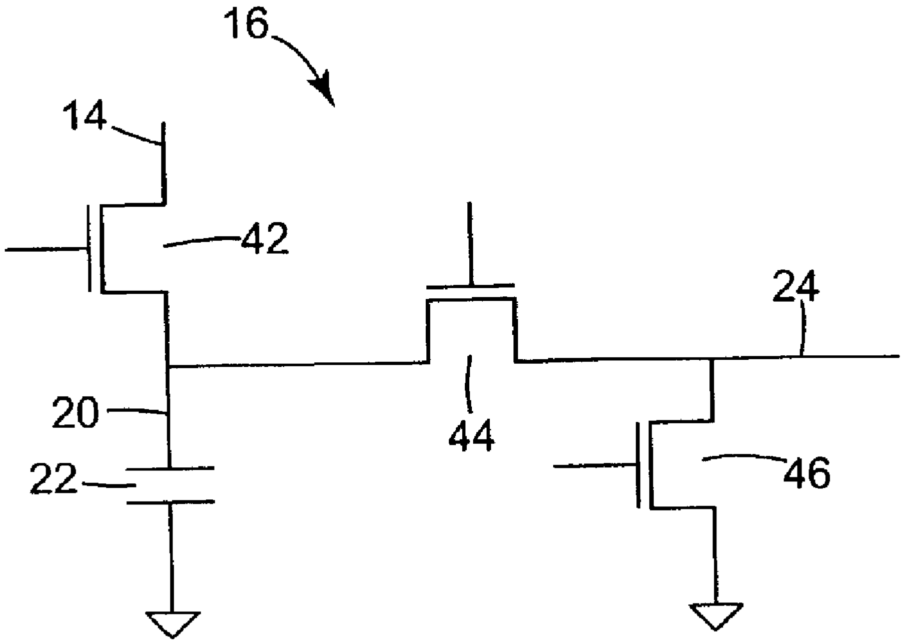
FIG. 3 is a schematic diagram illustrating an exemplary embodiment of a charge control circuit.

FIG. 3 is a schematic diagram illustrating an exemplary embodiment of a charge control circuit 16. The charge control circuit 16 includes a first switch 42 which is coupled to charge storage device 22 and which is configured to conduct the charge amount from line 14 to charge storage device 22. In the exemplary embodiment, line 14 is coupled to an output of variable power supply 12. In other embodiments, the charge amount can be provided from other suitable sources, such as a current source. In the exemplary embodiment, switch 42 is activated by controller 28 and provides a conductive path between line 14 and line 20, to conduct the charge amount to charge storage device 22.

In the exemplary embodiment, switch circuit 16 includes a second switch 44 which is coupled between line 20 and line 24. The switch 44 is activated by controller 28 to provide a conductive path to conduct charge from charge storage device 22 to micro-electromechanical device 26 which is coupled to line 24. With the conductive path, the charge storage device 22 and micro-electromechanical device 26 equalize to a same voltage. A third switch 46 is coupled between line 24 and a ground potential and is configured to discharge micro-electromechanical device 26 before the second switch 44 is activated to provide the conductive path between charge storage device 22 and micro-electromechanical device 26. In the exemplary embodiment, third switch 46 is activated by controller 28. In the exemplary embodiment, first switch 42 is activated to conduct the charge amount to charge storage device 22, and third switch 46 is activated to discharge the micro-electromechanical device 26, before second switch 44 provides the conductive path to equalize the charge storage device 22 and the micro-electromechanical device 26 to the same voltage. In the exemplary embodiment, controller 28 controls first switch 42, second switch 44 and third switch 46. In other embodiments, other suitable approaches can be used to control first switch 42, second switch 44 and third switch 46. In the exemplary embodiment, first switch 42, second switch 44 and third switch 46 are complimentary metal-oxide semiconductor (CMOS) transistors. In other embodiments, first switch 42, second switch 44 and third switch 46 can be other suitable device types which can be selected or activated to provide conductive paths. For example, in other embodiments, the switches can be other device types such as gallium arsenide metal-semiconductor field effect transistors (GaAs MESFETs) or bipolar transistors.

In one embodiment, micro-electromechanical device 26 is an electrostatically controlled parallel plate actuator 26 which includes a first plate 30 and a second plate 32. First switch 42 is configured to charge a capacitor 22 to a first voltage. Second switch 44 is configured to control a deflection distance between the first plate 30 and the second plate 32 by connecting the capacitor 22 and the parallel plate actuator 26 together in parallel so that the capacitor 22 charges the parallel plate actuator 26 to a second voltage. In this embodiment, the second voltage is less than the first voltage. Capacitor 22 charges the parallel plate actuator 26 to the second voltage, while capacitor 22 is discharged from the first voltage to the second voltage. In one embodiment, a third switch 46 is coupled across parallel plate actuator 26 and is configured to discharge parallel plate actuator 26 before second switch 44 connects the capacitor 22 and parallel plate actuator 26 together in parallel.

In one embodiment, micro-electromechanical device 26 is a passive pixel mechanism 26. Charge control circuit 16 includes a capacitor 22 which is configured to store a charge amount, a first switch 42 and a second switch 44. First switch 42 is coupled to capacitor 22 at line 20 and is configured to conduct the charge amount to capacitor 22. Second switch 44 is coupled to capacitor 22 at line 20 and to passive pixel mechanism 26. Second switch 44 provides a conductive path to equalize capacitor 22 and passive pixel mechanism 26 to a same voltage. In one embodiment, a third switch 46 is coupled at line 24 between the passive pixel mechanism 26 and a ground potential and is configured to discharge the passive pixel mechanism 26 before second switch 44 provides the conductive path. In one embodiment, variable power supply 12 is a variable voltage source 12 and is coupled to first switch 42 at line 14 and is configured to supply the charge amount to capacitor 22. The passive pixel mechanism 26 includes an electrostatically adjustable top reflector 30 and bottom reflector 32, which are configured to define a resonant optical cavity 34. Charge control circuit 16 is configured to select a visible wavelength for the passive pixel mechanism 26 by sharing the charge amount stored in capacitor 22 with the top reflector 30 and the bottom reflector 32 to control a deflection distance.

Figure 4:
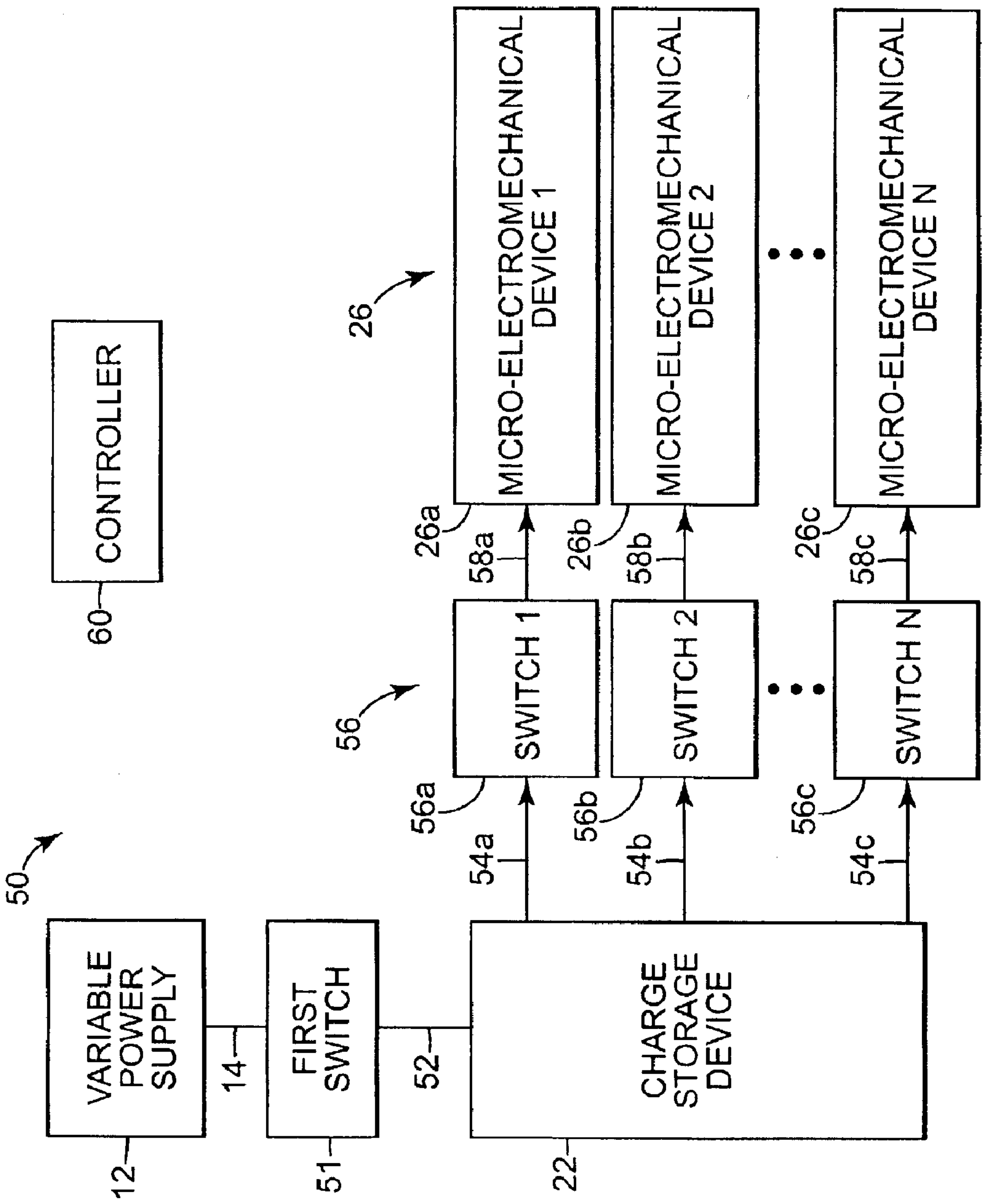
FIG. 4 is a diagram illustrating an exemplary embodiment of a micro-electromechanical system according to the present invention.

FIG. 4 is a diagram illustrating an exemplary embodiment of a micro-electromechanical system 50 according to the present invention. In the exemplary embodiment, micro-electromechanical system 50 includes a plurality of micro-electromechanical devices 26 which are illustrated at 26*a*, 26*b* and 26*c*, respectively, for micro-electromechanical device 1, 2 and N. In the exemplary embodiment, N can be any suitable number. Each one of the micro-electromechanical devices 26 includes a first plate 30 and a second plate 32. The micro-electromechanical system 50 includes charge storage device 22 which is configured to store a charge amount. Although only one charge storage device 22 is illustrated to simplify the explanation of the invention, in other embodiments, any suitable number of charge storage devices 22 can be used. A first switch is included at 51 and is configured to conduct the charge amount from variable power supply 12 to charge storage device 22 to charge the charge storage device 22 to a first voltage. First switch 51 is connected to variable power supply 12 via line 14, and is connected to charge storage device 22 via line 52.

Micro-electromechanical system 50 includes a variety of switches 56 that are illustrated at 56*a*, 56*b* and 56*c*, respectively, for switches 1, 2 and N. Each one of the switches 56 is configured to select a capacitance of a corresponding one of the micro-electromechanical devices 26 by sharing the charge amount between charge storage device 22 and the corresponding micro-electromechanical device 26 to equalize the charge storage device 22 and the corresponding micro-electromechanical device 26 to a same voltage. As such, switch 1 at 56*a* is coupled to charge storage device 22 via line 54*a* and to micro-electromechanical device 1 at 26*a* via line 58*a*. Similarly, switch 2 at 56*b* is coupled to charge storage device 22 via line 54*b* and to micro-electromechanical device 2 at 26*b* via line 58*b*, and switch N at 56*c* is coupled to charge storage device 22 via line 54*c* and to micro-electromechanical device N at 26*c* via line 58*c*. In the exemplary embodiment, N can be any suitable number so that there can be any suitable number of switches 56. Each switch 56 corresponds to a micro-electromechanical device 26. Each one of the switches 56 is configured to select a capacitance of the corresponding one of the micro-electromechanical device 26 by sharing the charge amount between the charge storage device 22 and the corresponding one of the micro-electromechanical devices 26 to equalize the charge storage device 22 and the corresponding one of the micro-electromechanical devices 26 to a same voltage. In the exemplary embodiment, each switch 56 is configured to discharge the corresponding one of the micro-electromagnetic devices 26 before the charge amount is shared between the charge storage device 22 and the corresponding one of the micro-electromechanical devices 26.

In the exemplary embodiment, the charge storage device 22 is charged from a ground potential to the first voltage, wherein the first voltage corresponds to the charge amount. After the charge is shared between the charge storage device 22 and the corresponding one of the micro-electromechanical devices 26, the micro-electromechanical device 26 is charged to a second voltage. The second voltage is less than the first voltage, and corresponds to a voltage value where the micro-electromechanical device 26 and the charge storage device 22 have equalized so that current is no longer conducted between the charge storage device 22 and the micro-electromechanical device 26.

Figure 5:
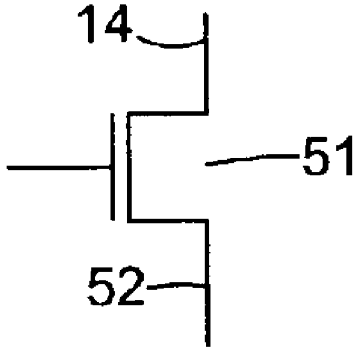
FIG. 5 is a schematic diagram illustrating an exemplary embodiment of a first switch.

FIG. 5 is a schematic diagram illustrating an exemplary embodiment of a first switch 51. First switch 51 is coupled between line 14 and line 52. In the exemplary embodiment, first switch 51 is controlled by controller 60 and is activated by controller 60 to provide a conductive path between power supply 12 at line 14 and charge storage device 22 at line 52, to provide the charge amount to charge storage device 22. In the exemplary embodiment, the first switch 51 is a CMOS transistor. In other embodiments, first switch 50 can be other suitable device types.

Figure 6:
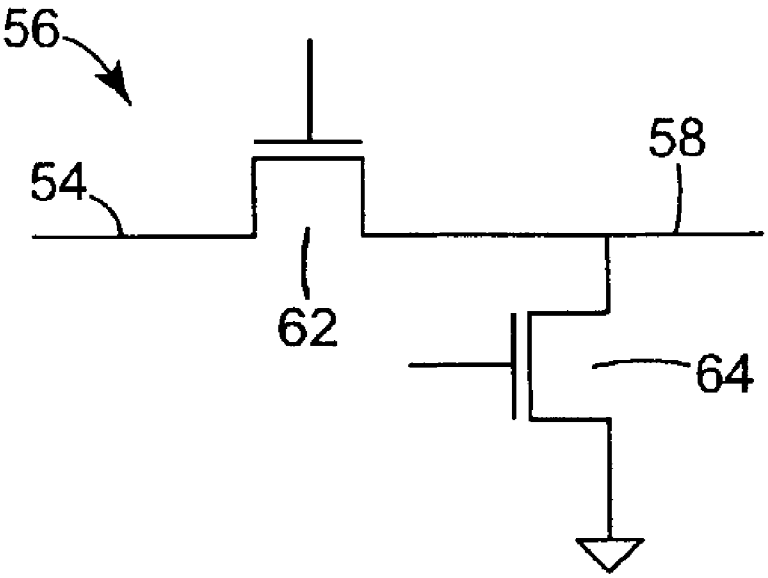
FIG. 6 is a schematic diagram illustrating an exemplary embodiment of a second and third switch.

FIG. 6 is a schematic diagram illustrating an exemplary embodiment of a second switch 62 and a third switch 64. Second switch 62 and third switch 64 are illustrated at 56. In the exemplary embodiment, second switch 62 can be activated to provide a conductive path between charge storage device 22 at line 54 and micro-electromechanical device 26 at line 58 to share a charge amount between charge storage device 22 and micro-electromechanical device 26. This equalizes charge storage device 22 and micro-electromechanical device 26 to the second voltage. In the exemplary embodiment, the second voltage is less than the first voltage. In the exemplary embodiment, once second switch 62 is activated or turned on into a conductive mode, charge storage device 22 is discharged from the first voltage to the second voltage, and micro-electromechanical device 26 is charged to the second voltage. In the exemplary embodiment, third switch 64 is coupled across micro-electromechanical device 26 at line 58 and a ground potential and is configured to discharge micro-electromechanical device 26 before second switch 62 connects charge storage device 22 and micro-electromechanical device 26 together in parallel.

In the exemplary embodiment, second switch 62 and third switch 64 are CMOS transistors. In other embodiments, second switch 62 and third switch 64 can be other suitable device types. In the exemplary embodiment, controller 60 controls and activates second switch 62 and third switch 64. In other embodiments, second switch 62 and third switch 64 can be controlled or activated by other suitable means.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A charge control circuit for controlling a micro-electromechanical device having a variable capacitance, comprising:

a charge storage device configured to store a charge amount; and a switch circuit configured to control the variable capacitance of the micro-electromechanical device by sharing the charge amount between the charge storage device and the micro-electromechanical device to equalize the charge storage device and the micro-electromechanical device to a same voltage.

2. The charge control circuit of claim 1, wherein the switch circuit includes:

a first switch coupled to the charge storage device and configured to conduct the charge amount to the charge storage device.

3. The charge control circuit of claim 2, wherein the switch circuit includes:

a second switch coupled between the charge storage device and the micro-electromechanical device and configured to provide a conductive path to equalize the charge storage device and the micro-electromechanical device to the same voltage.

4. The charge control circuit of claim 3, wherein the switch circuit includes:

a third switch coupled across the micro-electromechanical device and configured to discharge the micro-electromechanical device before the second switch provides the conductive path.

5. The charge control circuit of claim 4, wherein the first, second and third switches are complementary metal-oxide semiconductor (CMOS) transistors.

6. The charge control circuit of claim 2, comprising:

a voltage source coupled to the first switch and configured to supply the charge amount to the charge storage device.

7. The charge control circuit of claim 6, wherein the charge storage device is charged from a ground potential to a voltage which corresponds to the charge amount.

8. The charge control circuit of claim 1, wherein the charge storage device is a capacitor.

9. The charge control circuit of claim 1, comprising:

a current source configured to supply the charge amount to the charge storage device.

10. A micro-electromechanical system, comprising:

a plurality of micro-electromechanical devices, wherein each one of the micro-electromechanical devices includes a first plate and a second plate;

at least one charge storage device configured to store a charge amount;

a first switch configured to charge the charge storage device to a first voltage; and a plurality of second switches, wherein each one of the second switches is configured to control a capacitance of a corresponding one of the micro-electromechanical devices by sharing the charge amount between the charge storage device and the corresponding one of the micro-electromechanical devices to equalize the charge storage device and the corresponding one of the micro-electromechanical devices to a second voltage, wherein the second voltage is less than the first voltage.

11. The micro-electromechanical system of claim 10, further comprising:

a plurality of third switches, wherein each one of the third switches is coupled across the corresponding one of the micro-electromechanical devices and is configured to discharge the corresponding one of the micro-electromechanical devices before the corresponding one of the second switches connects the charge storage device and the corresponding one of the micro-electromechanical devices together in parallel.

12. The micro-electromechanical system of claim 11, wherein the first switch, the second switches and the third switches are complementary metal-oxide semiconductor (CMOS) transistors.

13. The micro-electromechanical system of claim 10, comprising:

a power supply coupled to the first switch and configured to supply the charge amount to the charge storage device.

14. The micro-electromechanical system of claim 13, wherein the charge storage device is charged from a ground potential to a first voltage which corresponds to the charge amount.

15. The micro-electromechanical system of claim 10, further comprising:

a controller configured to enable at least one of the second switches to select the capacitance of the corresponding one of the micro-electromechanical devices.

16. A micro-electromechanical system, comprising:

an electrostatically controlled parallel plate actuator which includes a first plate and a second plate;

a capacitor;

a first switch configured to charge the capacitor to a first voltage; and a second switch configured to control a deflection distance between the first plate and the second plate by connecting the capacitor and the parallel plate actuator together in parallel so that the capacitor charges the parallel plate actuator to a second voltage, wherein the second voltage is less than the first voltage.

17. The micro-electromechanical system of claim 16, further comprising:

a third switch coupled across the parallel plate actuator and configured to discharge the parallel plate actuator before the second switch connects the capacitor and the parallel plate actuator together in parallel.

18. The micro-electromechanical system of claim 17, wherein the first, second and third switches are complementary metal-oxide semiconductor (CMOS) transistors.

19. The micro-electromechanical system of claim 16, comprising:

a power supply coupled to the first switch and configured to supply the charge amount to the capacitor.

20. The micro-electromechanical system of claim 19, wherein the capacitor is charged from a ground potential to a voltage which corresponds to the charge amount.

21. The micro-electromechanical system of claim 16, wherein the parallel plate actuator includes:

a spring mechanism adapted to support the first plate and provide a restoring force to separate the first plate from the second plate; and a flexure attached to the spring mechanism which is adapted to support the second plate, wherein the spring mechanism and flexure maintain the first plate in an approximately parallel orientation with respect to the second plate at the deflection distance.

22. The micro-electromechanical system of claim 21, wherein the first plate is a top reflector and the second plate is a bottom reflector, and wherein the top reflector and the bottom reflector define a resonant optical cavity which variably selects a visible wavelength.

23. A display device, comprising:

a passive pixel mechanism which includes an electrostatically adjustable top reflector and bottom reflector configured to define a resonant optical cavity; and a charge storage circuit configured to select a visible wavelength of the passive pixel mechanism by sharing a stored charge amount with the top reflector and the bottom reflector to control a deflection distance.

24. The display device of claim 23, wherein the charge storage circuit includes:

a capacitor configured to store the charge amount;

a first switch coupled to the capacitor and configured to conduct the charge amount to the capacitor; and a second switch coupled between the capacitor and the passive pixel mechanism and configured to provide a conductive path to equalize the capacitor and the passive pixel mechanism to a same voltage.

25. The display device of claim 24, wherein the charge storage circuit includes:

a third switch coupled across the passive pixel mechanism and configured to discharge the passive pixel mechanism before the second switch provides the conductive path.

26. The display device of claim 24, comprising:

a voltage source coupled to the first switch and configured to supply the charge amount to the capacitor.

27. A charge control circuit for controlling a micro-electromechanical device having a variable capacitance, comprising:

means to store a charge amount; and means to control the variable capacitance of the micro-electromechanical device by sharing the stored charge amount with the micro-electromechanical device to equalize the micro-electromechanical device to a voltage.

28. A method of controlling a micro-electromechanical device having a variable capacitance, comprising:

storing a charge amount in a charge storage device; and sharing the charge amount between the charge storage device and the micro-electromechanical device to equalize the charge storage device and the micro-electromechanical device to a same voltage.

29. A method of controlling a micro-electromechanical device having a variable capacitance, wherein the micro-electromechanical device is coupled to a voltage source, comprising:

storing a charge amount in a charge storage device; and providing a conductive path between the charge storage device and the micro-electromechanical device to equalize the charge storage device and the micro-electromechanical device to a same voltage.

30. The method of claim 29, wherein storing the charge amount in the charge storage device includes discharging the micro-electromechanical device.

31. The method of claim 29, wherein storing the charge amount in the charge storage device includes:

selecting one of a number of voltage values, wherein each voltage value corresponds to a capacitance of the micro-electromechanical device; and charging the charge storage device up to the selected one of the voltage values.

* * * * *